(12) United States Patent
Adam et al.

(10) Patent No.: US 7,119,416 B1
(45) Date of Patent: Oct. 10, 2006

(54) BIPOLAR TRANSISTOR STRUCTURE WITH SELF-ALIGNED RAISED EXTRINSIC BASE AND METHODS

(75) Inventors: Thomas N. Adam, Poughkeepsie, NY (US); Kevin K. Chan, Staten Island, NY (US); Alvin J. Joseph, Williston, VT (US); Marwan H. Khater, Poughkeepsie, NY (US); Qizhi Liu, Essex Junction, VT (US); Beth Ann Rainey, Williston, VT (US); Kathryn T. Schonenberg, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/169,444

(22) Filed: Jun. 29, 2005

Related U.S. Application Data

(60) Division of application No. 10/904,482, filed on Nov. 12, 2004, now Pat. No. 7,037,798, and a continuation-in-part of application No. 10/707,756, filed on Jan. 9, 2004, now Pat. No. 6,869,852.

(51) Int. Cl.
*H01L 27/82* (2006.01)
*H01L 29/70* (2006.01)

(52) U.S. Cl. .................... 257/592; 257/E21.044
(58) Field of Classification Search ............... 438/309, 438/320, 339, 349, 348, 350, 366; 257/565, 257/592, 583
See application file for complete search history.

(56) References Cited

U.S. PATENT DOCUMENTS 5,117,271 A    5/1992   Comfort et al.
5,128,271 A    7/1992   Bronner et al.
5,266,505 A    11/1993  Ahlgren et al.
5,494,836 A    2/1996   Imai
5,506,427 A    4/1996   Imai
5,599,723 A    2/1997   Sato
5,962,880 A    10/1999  Oda et al.
6,080,631 A    6/2000   Kitahata (Continued)

FOREIGN PATENT DOCUMENTS

JP    2002313798    9/2002

OTHER PUBLICATIONS

Washio, K. et al., "A Selective-Epitaxial-Growth SiGe-Base HBT With SMI Electrodes Featuring 9.3-ps ECL-Gate Delray," IEEE Transactions on Electron Devices, vol. 46, No. 7, Jul. 1999, pp. 1411-1416.

*Primary Examiner*—W. David Coleman
(74) *Attorney, Agent, or Firm*—James J. Cioffi; Hoffman, Warnick D'Alessandro

(57) ABSTRACT

The invention includes methods of fabricating a bipolar transistor that adds a silicon germanium (SiGe) layer or a third insulator layer of, e.g., high pressure oxide (HIPOX), atop an emitter cap adjacent the intrinsic base prior to forming a link-up layer. This addition allows for removal of the link-up layer using wet etch chemistries to remove the excess SiGe or third insulator layer formed atop the emitter cap without using oxidation. In this case, an oxide section (formed by deposition of an oxide or segregation of the above-mentioned HIPOX layer) and nitride spacer can be used to form the emitter-base isolation. The invention results in lower thermal cycle, lower stress levels, and more control over the emitter cap layer thickness, which are drawbacks of the first embodiment. The invention also includes the resulting bipolar transistor structure.

6 Claims, 22 Drawing Sheets

U.S. PATENT DOCUMENTS

| | | |
|---|---|---|
| 6,346,453 B1 | 2/2002 | Kovacic et al. |
| 6,437,376 B1 | 8/2002 | Ozkan |
| 6,472,262 B1 | 10/2002 | Chantre et al. |
| 6,509,242 B1 | 1/2003 | Frei et al. |
| 6,531,369 B1 | 3/2003 | Ozkan et al. |
| 6,559,020 B1 | 5/2003 | Salmi |
| 6,617,220 B1 * | 9/2003 | Dunn et al. ............... 438/309 |
| 6,809,024 B1 * | 10/2004 | Dunn et al. ............... 438/623 |
| 6,869,582 B1 * | 3/2005 | Bailey et al. ............... 423/460 |
| 6,974,977 B1 * | 12/2005 | Washio et al. ............... 257/197 |
| 2002/0060353 A1 * | 5/2002 | Matsuoka ............... 257/592 |
| 2002/0132438 A1 | 9/2002 | Dunn et al. |
| 2002/0192894 A1 | 12/2002 | Kalnitsky et al. |
| 2003/0057458 A1 | 3/2003 | Freeman et al. |
| 2003/0064555 A1 | 4/2003 | Ahlgren et al. |
| 2005/0151225 A1 * | 7/2005 | Adam et al. ............... 257/565 |

* cited by examiner

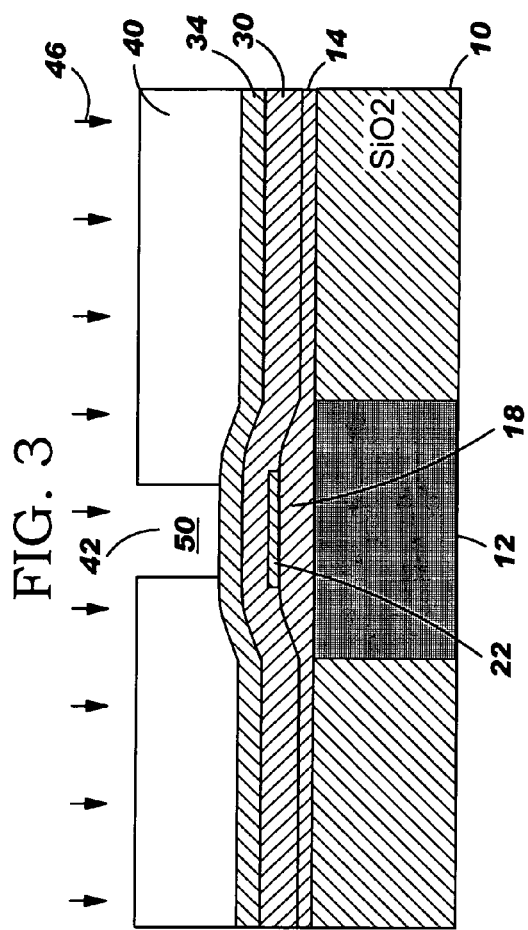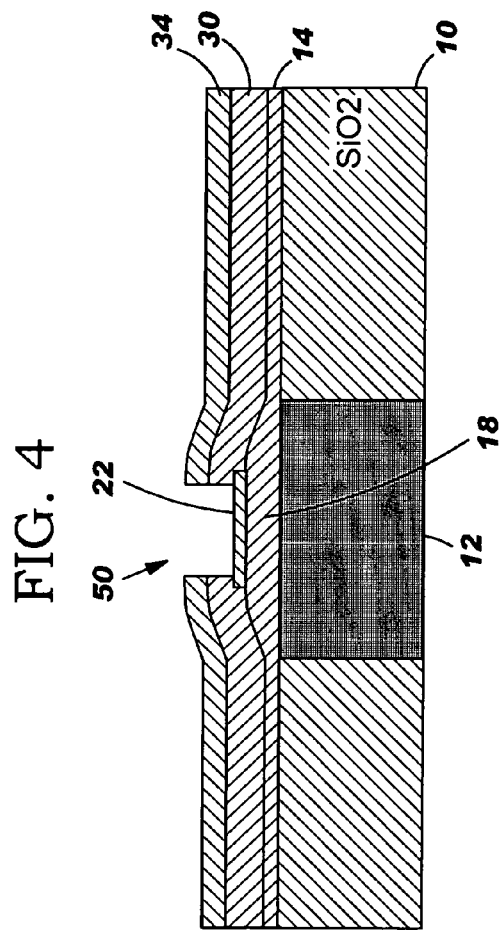

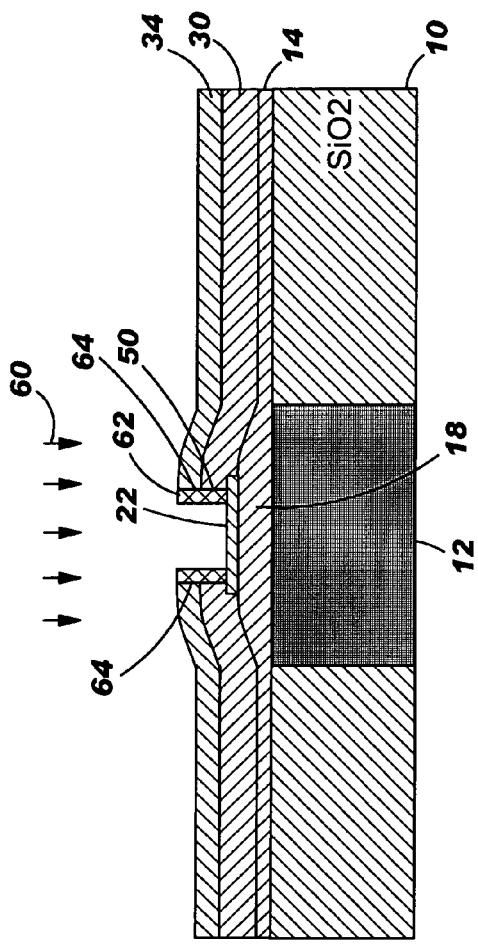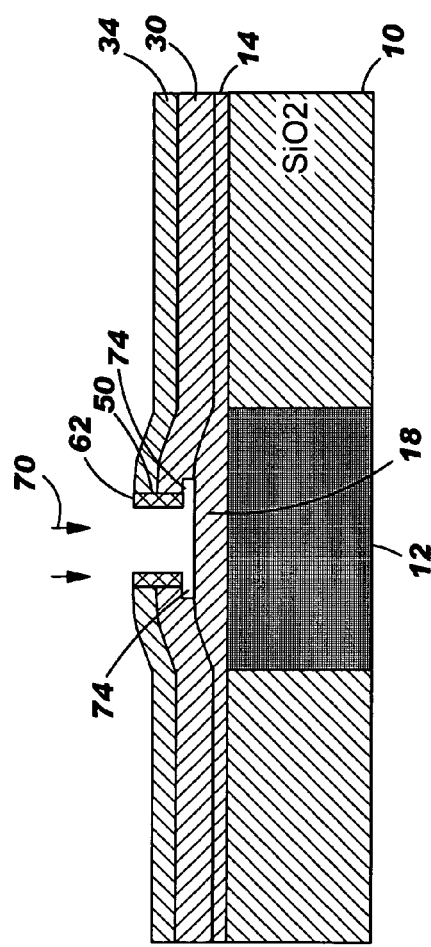

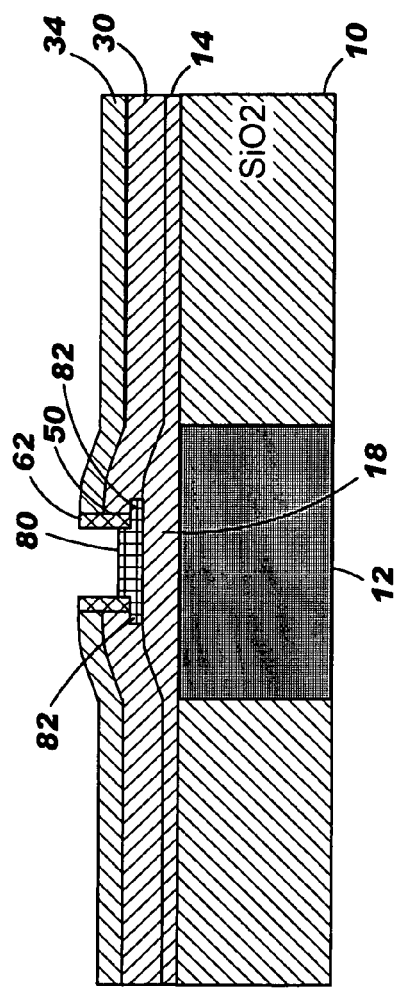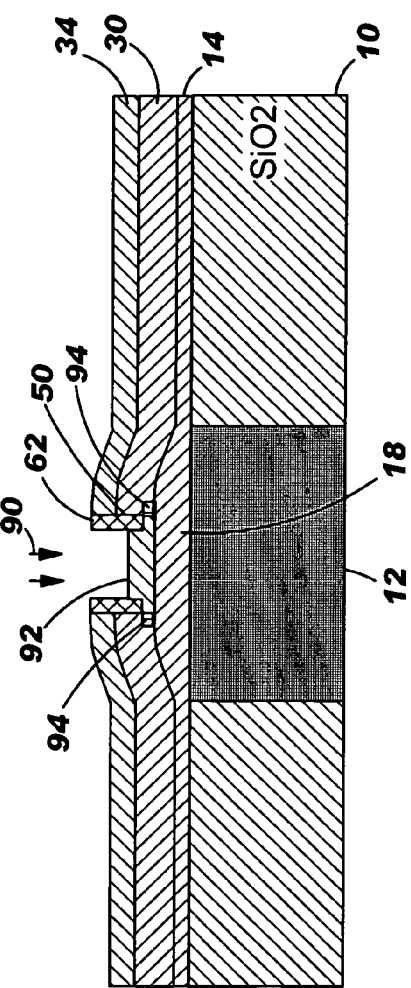

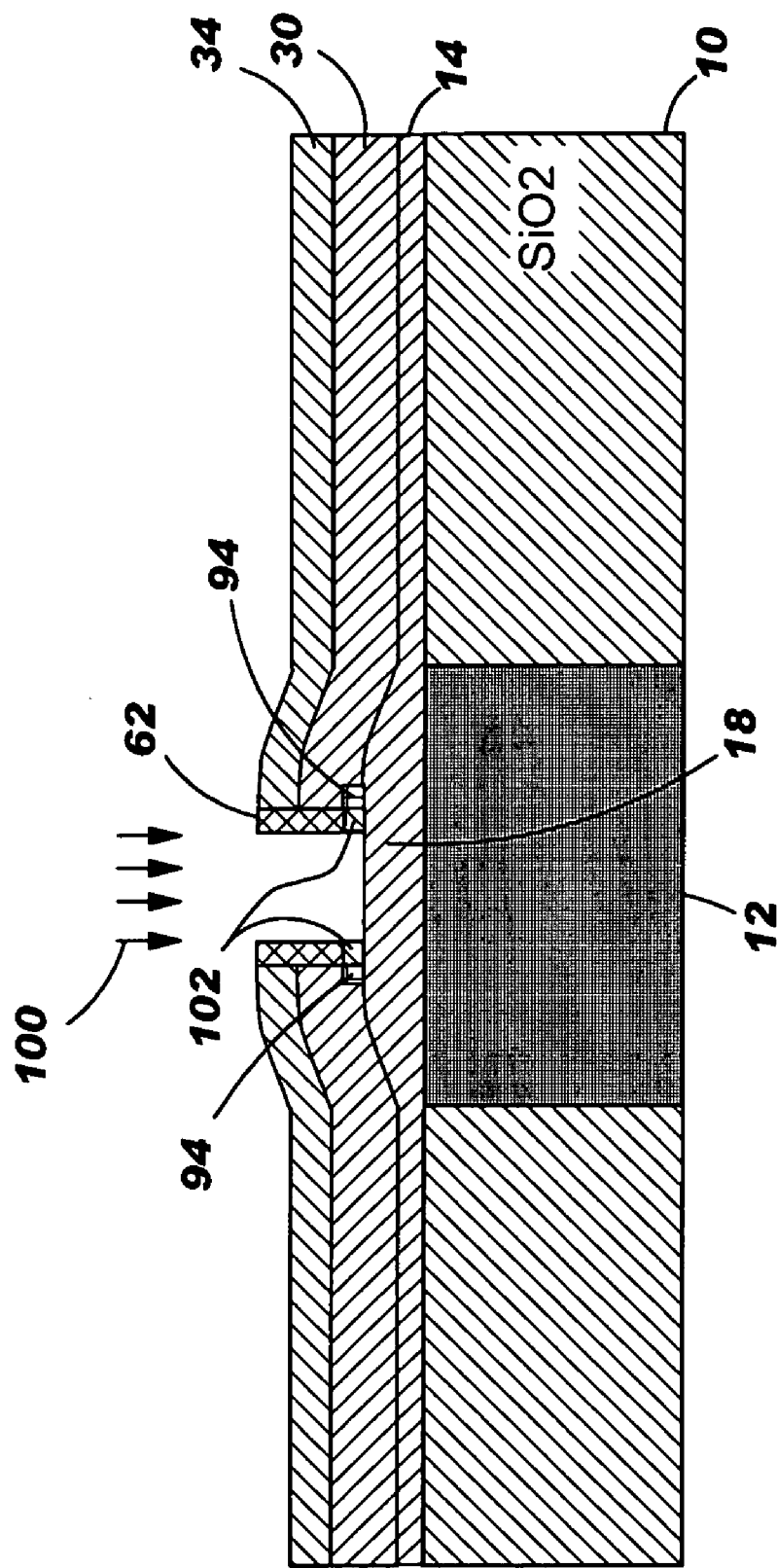

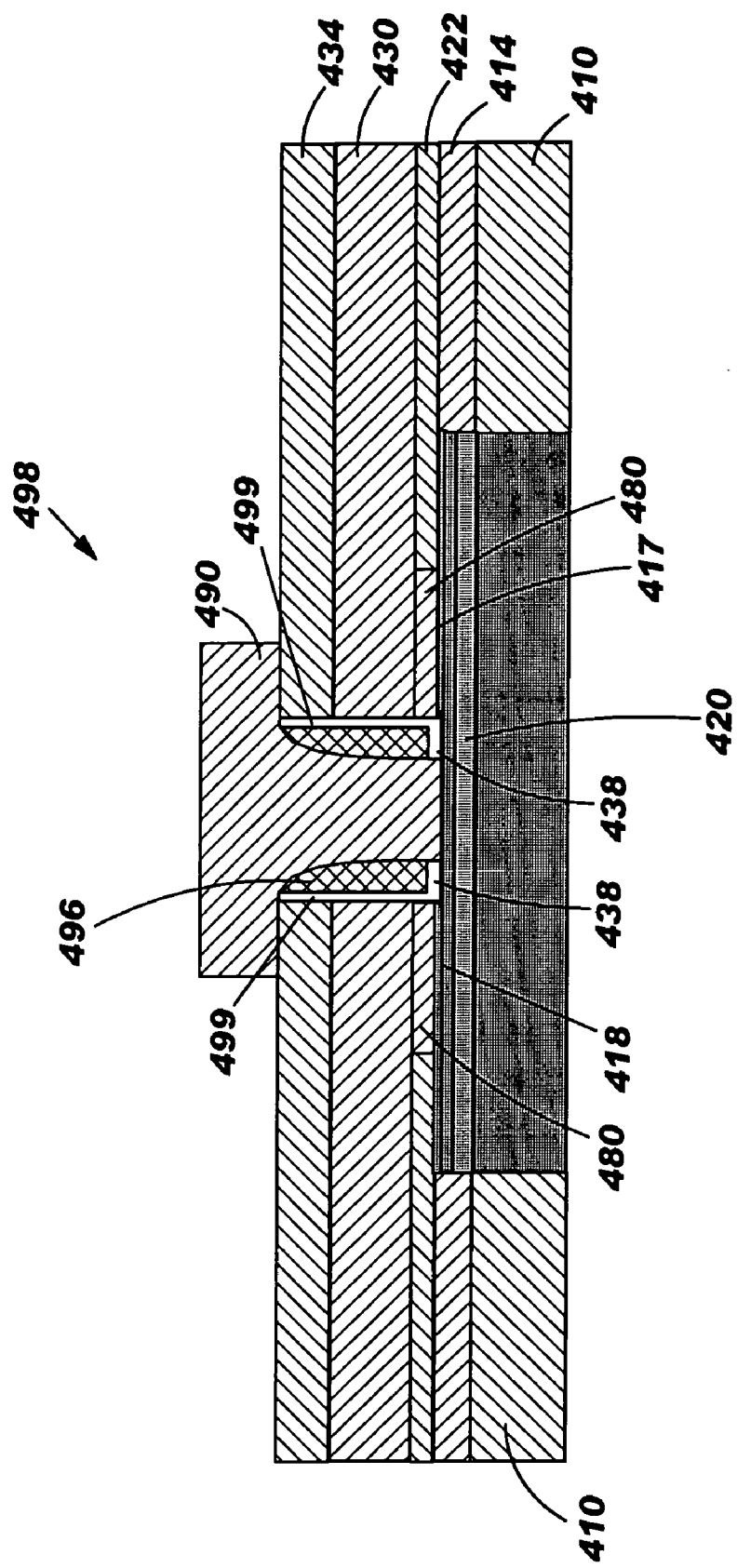

US 7,119,416 B1

BIPOLAR TRANSISTOR STRUCTURE WITH SELF-ALIGNED RAISED EXTRINSIC BASE AND METHODS

This application is a divisional of application Ser. No. 10/904,482, filed Nov. 12, 2004, now U.S. Pat. No. 7,037,798.

RELATED APPLICATION

This application is a continuation-in-part of application Ser. No. 10/707,756, filed Jan. 9, 2004 now U.S. Pat. No. 6,869,852.

STATEMENT REGARDING FEDERALLY SPONSORED RESEARCH OR DEVELOPMENT

The subject matter of the present application was at least partially funded under Defense Advanced Research Projects Agency (DARPA) Contract No. N66001-02-C-8014.

BACKGROUND OF THE INVENTION

1. Technical Field

The present invention relates generally to bipolar transistors, and more particularly, to a bipolar transistor structure with a self-aligned raised extrinsic base and method of fabricating the same.

2. Related Art

Self-aligned bipolar transistors with raised extrinsic base are the focus of integrated circuits fabricated for high performance mixed signal applications. Producing bipolar transistors for high speed applications requires improvements to the NPN junction to improve unit current gain frequency ($f_T$) and maximum oscillation frequency ($f_{MAX}$). $f_T$ is inversely proportional to base transit time (tb) (i.e., 1/tb) and collector-base capacitance (Ccb) (i.e., 1/Ccb). One approach to reduce transit time is to eliminate base widening due to thermal enhanced diffusion (TED) effects on the extrinsic base and loss of intrinsic base definition caused by the lateral diffusion of dopants during implantation of the extrinsic base. A deposited, raised extrinsic base eliminates implant damage in the intrinsic base region and therefore does not precipitate base widening during formation. A more important RF design parameter is $f_{MAX}$, which is proportional to $(f_T/(Rb*Ccb))^{0.5}$. $f_{MAX}$ benefits from improved $f_T$ and collector-base capacitance (Ccb), but also requires reducing base resistance (Rb). There are several methods to improve Rb, an important aspect of which is emitter-base alignment. A fully self-aligned raised extrinsic base method will improve $f_T$ and $f_{MAX}$ of a bipolar transistor. Current approaches to achieve these improvements increase process complexity in order to maintain the extrinsic base self-aligned to the emitter, or employ a non-self aligned (NSA) structure in favor of a more simple process.

An approach for self-aligned with raised extrinsic base fabrication is disclosed by Chantre et al. in U.S. Pat. No. 6,472,262 B2. However, the Chantre et al. process results in less lateral control and higher base resistance due to continuous oxide layer 20, which leads to not only increased Rb but also poorer Rb control. Etch selectivity of silicon-germanium to silicon is required.

Another approach is disclosed in Ahlgren in US Publication No. 2003-0064555A1. However, this process is complex.

Another challenge to improving ICs fabricated for high performance mixed signal applications is that performance of self-aligned bipolar transistors with extrinsic base degrades as the emitter dimension is reduced due to loss of intrinsic base definition caused by the lateral diffusion of dopants. To maintain high electrical performance, bipolar transistors must have a polysilicon extrinsic base layer self-aligned to the emitter on top of the epitaxially grown intrinsic silicon germanium (SiGe) base. That is, a raised extrinsic base must exist. Transistors fabricated using this approach have demonstrated the highest unit current gain frequency ($f_T$) (also referred to as cutoff frequency) and the maximum oscillation frequency ($F_{MAX}$) to date.

A number of approaches of forming a self-aligned bipolar transistor with raised polysilicon extrinsic base have been implemented. In one approach, chemical mechanical polishing (CMP) is used to planarize the extrinsic base polysilicon over a pre-defined sacrificial emitter pedestal, as disclosed by Bronner et al. in U.S. Pat. No. 5,128,271 and Kovacic et al. in U.S. Pat. No. 6,346,453. In this approach, an extrinsic base of area A and depth D is constructed to have a low aspect ratio (D/A<<1), which can lead to a significant difference in the extrinsic base layer thickness between the small and large devices, and isolated and nested devices, due to dishing caused by the CMP.

In another approach, an intrinsic base is grown using selective epitaxy inside an emitter opening and an undercut is formed under the extrinsic base polysilicon, as disclosed by Imai in U.S. Pat. Nos. 5,494,836 and 5,506,427, Sato in U.S. Pat. No. 5,599,723 and Oda et al. in U.S. Pat. No. 5,962,880. In this approach, the self-alignment of the extrinsic base is achieved with the epitaxial growth inside the undercut. Unfortunately, special techniques are required to ensure a good link-up contact between the intrinsic base and the extrinsic base.

In the parent application, the approach implemented an epitaxial growth to link the extrinsic base to an intrinsic base that is grown non-selectively. One drawback of this approach is that the epitaxial growth to form the link-up also forms a silicon layer over the emitter cap layer at the bottom of the opening. As a result, the silicon layer needs to be oxidized to consume the excess silicon. The oxidation of the excess silicon layer is detrimental in a number of ways. First, it causes widening of the base profile, which reduces $f_T$. Second, it causes non-uniform emitter cap thickness because it is difficult to control the depth of penetration of the oxidation. This situation results in widespread transistor current gain, $I_{collector}/I_{base}$. Finally, it causes stress at the bottom corners of the emitter/base junction.

Other approaches to achieve these improvements increase process complexity in order to maintain the extrinsic base self-aligned to the emitter, or employ a non-self aligned (NSA) structure in favor of a more simple process.

In view of the foregoing, there is a need in the art for a method of fabricating a self-aligned bipolar transistor structure that does not suffer from the problems of the related art.

SUMMARY OF THE INVENTION

In one embodiment, the invention includes a method of fabricating a bipolar transistor structure that provides $f_T$ and $f_{MAX}$ improvements of a raised extrinsic base using non-self-aligned techniques to establish a self-aligned structure. Accordingly, the invention eliminates the complexity and cost of current self-aligned raised extrinsic base processes. The invention forms a raised extrinsic base and an emitter opening over a landing pad, i.e., etch stop layer, then replaces the landing pad with a conductor that is converted, in part, to an insulator. An emitter is then formed in the emitter opening once the insulator is removed from the emitter opening. An unconverted portion of the conductor provides a conductive base link and a remaining portion of the insulator under a spacer isolates the extrinsic base from the emitter while maintaining self-alignment of the emitter to the extrinsic base. The invention also includes the resulting bipolar transistor structure.

A first aspect of the invention is directed to a method for fabricating a bipolar transistor with a raised extrinsic base, an emitter and a collector, the method comprising the steps of: a) providing an intrinsic base layer; b) forming a first insulator layer on a portion of the intrinsic base layer; c) forming a raised extrinsic base layer on the first insulator layer and the intrinsic base layer; d) forming a second insulator layer on the extrinsic base layer; e) providing an emitter opening by selectively removing portions of the extrinsic base layer and the second insulator layer to expose a portion of the first insulator layer; f) forming a spacer along a sidewall of the emitter opening; g) selectively removing the first insulator layer; h) forming a conductor in a space vacated by the first insulator layer; i) converting the conductor within the emitter opening to a third insulator such that the third insulator extends under at least a portion of the spacer; and j) forming the emitter.

A second aspect of the invention is directed to a self-aligned bipolar transistor structure comprising: an intrinsic base layer; a raised extrinsic base layer in direct contact with the intrinsic base layer; an emitter separated from the raised extrinsic base layer by a spacer and an oxide section under at least a portion of the spacer; and a conductive base link between the oxide section and the raised extrinsic base layer.

A third aspect of the invention is directed to a method for fabricating a bipolar transistor with a raised extrinsic base, an emitter and a collector, the method comprising the steps of: a) providing a landing pad positioned between an intrinsic base layer and an extrinsic base layer; b) providing an emitter opening by selectively removing portions of the extrinsic base layer to expose a portion of the landing pad; c) forming a spacer along a sidewall of the emitter opening; d) selectively removing the landing pad from the emitter opening, under the spacer and under a portion of the extrinsic base layer; e) forming a conductor in a space vacated by the landing pad; f) converting the conductor in the emitter opening and at least a portion under the spacer to an insulator; g) removing the insulator from within the emitter opening; and h) forming the emitter.

In other embodiments, the invention includes methods of fabricating a bipolar transistor that adds a silicon germanium (SiGe) layer or a third insulator layer of, e.g., high pressure oxide HIPOX), atop an emitter cap on top of the intrinsic base prior to forming a link-up layer. This addition allows for removal of the link-up layer using wet etch chemistries to remove the excess SiGe or third insulator layer formed atop the emitter cap without using oxidation. In this case, an oxide section (formed by deposition of an oxide or segregation of the above-mentioned HIPOX layer) and nitride spacer can be used to form the emitter-base isolation. The invention results in lower thermal cycle, lower stress levels, and more control over the emitter cap layer thickness, which are drawbacks of the first embodiment. The invention also includes the resulting bipolar transistor structure.

A fourth aspect of the invention is directed to a method for fabricating a bipolar transistor with a raised extrinsic base, an emitter and a collector, the method comprising the steps of: a) providing a structure including an intrinsic base, an emitter cap and an intrinsic base layer adjacent the intrinsic base, a first insulator layer on the emitter cap, a raised extrinsic base layer over the first insulator layer, and a second insulator layer over the raised extrinsic base layer; b) forming an emitter opening by selectively removing portions of the raised extrinsic base layer and the second insulator layer to expose the first insulator layer; c) forming a first spacer along a sidewall of the emitter opening; d) selectively removing the first insulator layer inside the emitter opening only; e) forming a third insulator layer in a lower portion of the emitter opening; f) selectively removing the first insulator layer to form an undercut under the raised extrinsic base layer; g) forming a conductive link layer in the emitter opening that fills the undercut; h) selectively removing the conductive link layer to the third insulator layer within the emitter opening; and i)-forming the emitter.

A fifth aspect of the invention is directed to a method for fabricating a bipolar transistor with a raised extrinsic base, an emitter and a collector, the method comprising the steps of: a) providing a structure including a intrinsic base, an emitter cap and intrinsic base layer adjacent the intrinsic base, a silicon-germanium (SiGe) etch-stop layer over the emitter cap, a first insulator layer on the emitter cap, a raised extrinsic base layer over the first insulator layer, and a second insulator layer over the raised extrinsic base layer; b) forming an emitter opening by selectively removing portions of the extrinsic base layer and the second insulator layer selective to the first insulator layer; c) forming a first spacer along a sidewall of the emitter opening; d) selectively removing the first insulator layer to form an undercut under the raised extrinsic base layer; e) forming a conductive link layer that fills the undercut; f) selectively removing the conductive link layer to the SiGe etch-stop layer in the emitter opening; g) selectively removing the SiGe etch-stop layer in emitter opening to expose the emitter cap; h) removing the first spacer; i) forming a third insulator layer about the emitter opening; j) forming a second spacer in the emitter opening; k) removing the third insulator layer as defined by the second spacer; and l) forming the emitter.

A sixth aspect of the invention is directed to a self-aligned bipolar transistor structure comprising: an intrinsic base layer adjacent an intrinsic base and an emitter cap; a raised extrinsic base layer; an emitter separated from the raised extrinsic base layer by a spacer and an oxide section under the spacer; and a conductive base link adjacent the oxide section and below the raised extrinsic base layer, wherein the raised extrinsic base layer is linked to the intrinsic base by the emitter cap and the conductive base link.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein:

FIG. 3 shows a third step of the first embodiment of the method.

FIG. 4 shows a fourth step of the first embodiment of the method.

FIG. 5 shows a fifth step of the first embodiment of the method.

FIG. 6 shows a sixth step of the first embodiment of the method.

FIG. 7 shows a seventh step of the first embodiment of the method.

FIG. 8 shows an eighth step of the first embodiment of the method.

FIG. 9 shows a ninth step of the first embodiment of the method.

FIG. 26 shows a sixth step of the third embodiment of the method.

DETAILED DESCRIPTION OF THE INVENTION

1. First Embodiment

Figure 1:
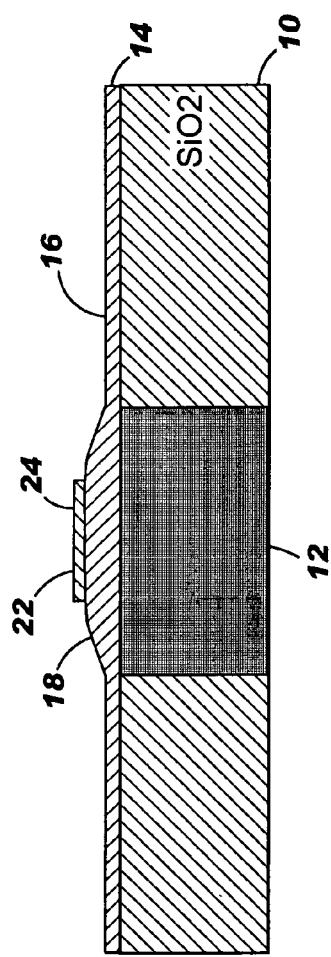
FIG. 1 shows a first step of a first embodiment of a method of fabricating a bipolar transistor with a raised extrinsic base.
Figure 10:
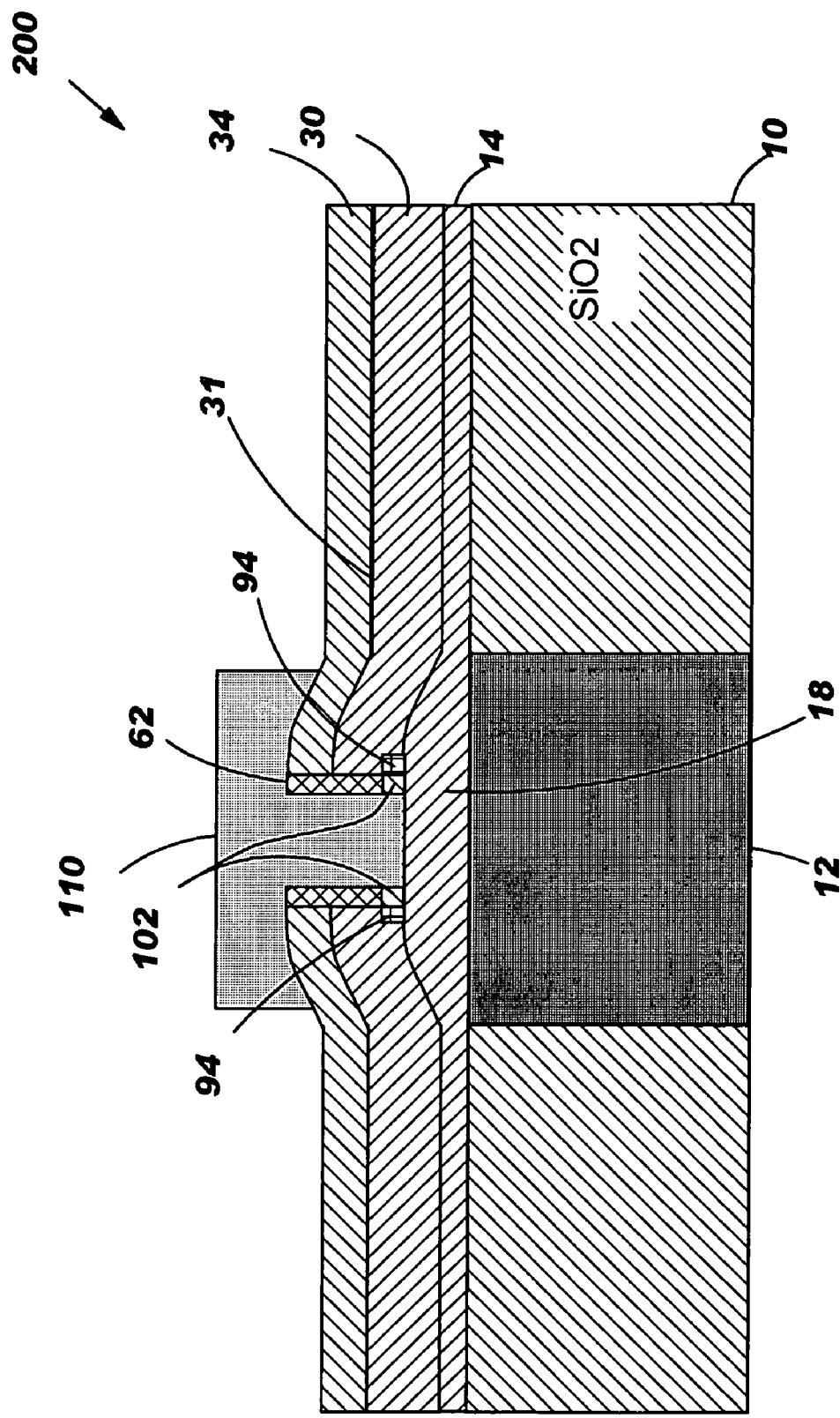
FIG. 10 shows a tenth step of the first embodiment of the method and a resulting bipolar transistor.

With reference to the accompanying drawings, FIGS. 1–10 illustrate a first embodiment of the invention. FIG. 1 shows a starting point for the processing of the invention according to the first embodiment. In FIG. 1, a shallow-trench isolation (STI) 10 is provided of silicon dioxide ($SiO_2$) (hereinafter "oxide") having an active silicon (Si) region 12 in a portion thereof. A low temperature epitaxial (LTE) growth of silicon over this structure results in an intrinsic base layer 14 including a polysilicon portion 16 formed over STI 10 and a silicon intrinsic base portion 18 formed over active silicon region 12. Intrinsic base portion 18, as will become apparent below, provides an intrinsic base of a resulting self-aligned bipolar transistor structure 200 (FIG. 10).

A first insulator layer (not shown in its entirety) is then formed over intrinsic base layer 14, patterned and etched to form a landing pad 22, i.e., an etch stop layer, on a portion 24 of intrinsic base portion 18. Landing pad 22 may be formed, for example, by conducting a high temperature oxidation (HTO) or by a high-pressure oxidation (HIPOX) process, and then patterning and etching away the oxide layer. The above noted oxidation processes are meant to be illustrative, and other processes may also be applicable. For example, landing pad 22 may be formed of silicon nitride, or multiple layers of insulator/conductor or insulator/insulator.

Figure 2:
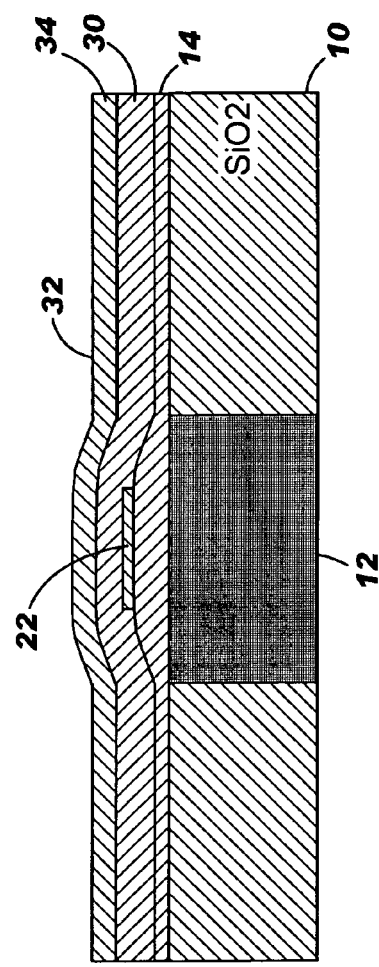
FIG. 2 shows a second step of the first embodiment of the method.

FIG. 2 illustrates forming a raised extrinsic base layer 30 on the first insulator layer (i.e., landing pad 22) and intrinsic base layer 14 to provide an extrinsic base 32. Extrinsic base layer 30 may include a polysilicon and/or a single crystal silicon. The polysilicon/silicon may include a dopant such as boron. A second insulator layer 34 such as an oxide layer may then be formed, e.g., by deposition, on extrinsic base layer 30. Second insulator layer 34 may be of any type of deposited oxide or nitride such as high density plasma (HDP) oxide, high-temperature oxide (HTO), TEOS oxide, etc.

FIG. 3 illustrates providing an emitter opening 50 using an emitter window mask layer 40 including an emitter window 42. Mask layer 40 may be any now known or later developed mask. At this point, as shown in FIG. 4, portions of extrinsic base layer 30 and second insulator layer 34 are removed using an etch 46. Etch 46 extends through second insulator layer 34 and extrinsic base layer 30 to expose a portion of the first insulator layer, i.e., landing pad 22. Etch 46 may be, for example, a selective reactive ion etch (RIE).

As shown in FIGS. 5–6, a next step includes selectively removing the first insulator layer, i.e., landing pad 22. If allowed to remain, oxide landing pad 22 under extrinsic base layer 30 results in higher resistance. As shown in FIG. 5, a first part of removing landing pad 22 includes forming an inner silicon nitride (hereinafter "nitride") spacer 62 on a sidewall 64 of emitter opening 50 in a conventional fashion, e.g., by depositing a nitride layer (actual layer not shown) and etching 60 to form spacer 62. Next, as shown in FIG. 6, a wet etch 70 is conducted to selectively remove the first insulator layer, i.e., landing pad 22, from emitter opening 50 and under spacer 62 (openings 74). In addition, a portion under extrinsic base layer 30 is also removed. Wet etch 70 may include, for example, a buffered hydro-fluoric acid (BHF) or diluted HF etch or another conventional wet etch. It should be recognized that spacer 62 may also be constructed after removal of landing pad 22, i.e., the order or processing is not critical.

In FIG. 7, a conductor 80 is formed in a space vacated by landing pad 22, i.e., in emitter opening 50, under spacer 62 and under the portion of extrinsic base layer 30. Conductor 80 may be formed by a low temperature epitaxial (LTE) growth of silicon. As the LTE growth occurs, single crystal silicon re-grows in emitter opening 50 and within openings 74 under spacer 62 and the portion of extrinsic base layer 30 where landing pad 22 existed. As a result, conductor 80 forms a conductive base link 82 between extrinsic base layer 30 and intrinsic base layer 14, and in particular, intrinsic base portion 18. In contrast to landing pad 22, base link 82 provides a direct link between extrinsic base layer 30 and intrinsic base portion 18.

Next, as shown in FIG. 8, an oxidation 90 is conducted such as high pressure oxidation (HIPOX) 90 into emitter opening 50 to form an oxide portion 92 from conductor 80 (FIG. 7) within emitter opening 50 and from any conductor (not shown) formed on spacer 62 sidewalls and second insulator layer 34. Where a conductor is formed on spacer 62 sidewalls and second insulator layer 34, oxidation 90 may form a continuous layer, which is later removed as will be discussed below. The amount of oxidation determines how far into conductor 80 the oxide portion 92 is formed, and as will be more apparent below, the spacing between extrinsic base layer 30 and emitter 110 (FIG. 10). As illustrated in FIG. 8, oxide portion 92 separates base link 94 from emitter opening 50. In one embodiment, oxide portion 92 exists within emitter opening 50 and under at least a portion of spacer 62. Depending on the amount of oxidation provided, oxide portion 92 may also extend under a portion of extrinsic base layer 30. However, it is preferable, that oxide portion 92 be present only under spacer 62 to reduce the link resistance between extrinsic base layer 30 and intrinsic base layer 14, 18.

Next, as shown in FIG. 9, an etch 100 to remove oxide portion 92 within emitter opening 50 is conducted. Etch 100 may also remove any oxide from spacer 62 sidewalls and atop second insulator layer 34 if present. Etch 100 can be, for example, a chemical-oxide remove (COR) etch, reactive ion etch (RIE) or a dilute hydrofluoric acid (DHF) etch. The former includes reacting oxide portion 92 to form a reaction product, as described in U.S. Pat. No. 5,282,925, which is hereby incorporated by reference. In one embodiment, oxide portion 92 is reacted by exposure to a vapor phase etch comprising hydrogen fluoride and ammonia gas. In another embodiment, the vapor phase etch may comprise ammonia bifluoride. The conditions and concentrations of material may vary according to specific applications. The reaction product includes etched oxide and reactants and combinations thereof. Removal of the reaction product may be accomplished by: evaporating the reaction product from the surface, for example, by heating the substrate, or by rinsing the surface with water ($H_2O$).

As shown in FIG. 9, as a result of the above-described etch, oxide portion 92 is removed within emitter opening 50. Note, however, a remaining portion 102 of oxide portion 92 remains below at least a portion of spacer 62 and, possibly, a portion of extrinsic base layer 30 depending on the amount of oxidation. Remaining portion 102 provides insulation between extrinsic base layer 30 and a to-be-formed emitter. In addition, the size of remaining portion 102 defines a spacing between emitter 110 (FIG. 10) formed in the emitter opening and base link 82 and/or extrinsic base layer 30.

Finally, as shown in FIG. 10, a polysilicon layer is deposited, patterned and etched to form emitter 110 within the emitter opening. It should be recognized that as a polysilicon layer is deposited, it may be re-aligned, i.e., some portion is converted to a monocrystalline silicon. Other processing to finalize transistor 200 may be conducted according to any now known or later developed manner. Transistor 200 includes an intrinsic base layer 14, 18; a raised extrinsic base layer 30 in direct contact with intrinsic base layer 14, 18; an emitter 110 separated from raised extrinsic base layer 30 by spacer 62 and oxide section 102 (of converted conductor) under spacer 62; and a conductive base link 94 between oxide section 102 and raised extrinsic base layer 30. In addition, raised extrinsic base layer 30 is non-planar.

2. Second Embodiment

Figure 11:
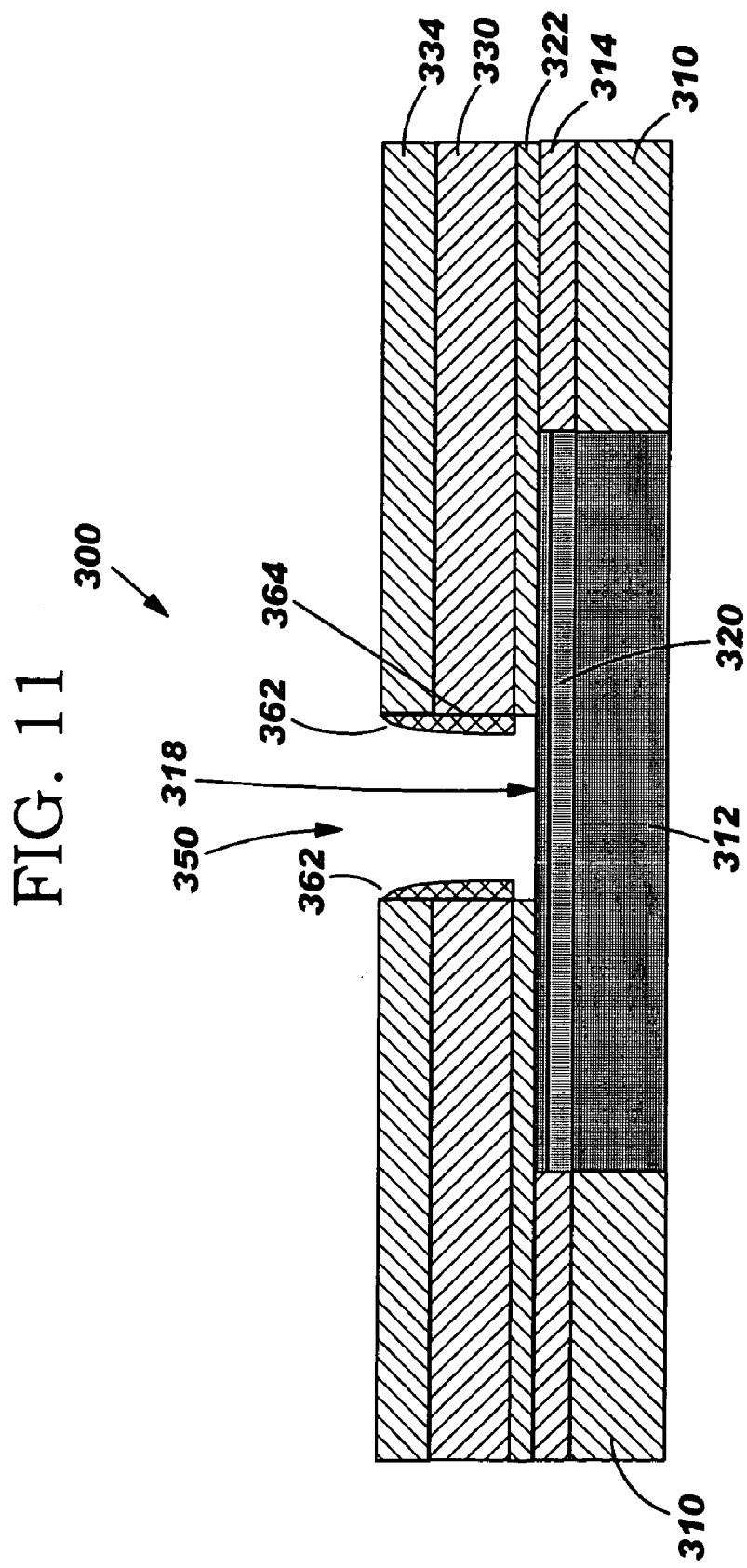
FIG. 11 shows a first step of a second embodiment of a method of fabricating a bipolar transistor with a raised extrinsic base.

Referring to FIGS. 11–18, a second embodiment of the invention will now be described. FIG. 11 illustrates a starting point for the processing of the invention according to the second embodiment. In FIG. 11, a structure 300 is provided including a polycrystalline intrinsic base layer 314, an intrinsic base 320 and an emitter cap 318 adjacent polycrystalline intrinsic base layer 314, a first insulator layer 322 on emitter cap 318, a raised extrinsic base layer 330 over first insulator layer 322, and a second insulator layer 334 over raised extrinsic base layer 330. Emitter cap 318 and intrinsic base 320 are provided over an active silicon region 312. Emitter cap 318 may be formed by a low temperature epitaxial silicon growth over a silicon-germanium containing layer of intrinsic base 320, which is over active silicon region 312. Polycrystalline intrinsic base layer 314 is adjacent to emitter cap 318 and intrinsic base 320. Polycrystalline intrinsic base layer 314 and extrinsic base layer 330 may include, for example, polysilicon or polycrystalline silicon-germanium (SiGe). Polycrystalline intrinsic base layer 314 is deposited over shallow trench isolation (STI) 310 of, for example, silicon dioxide. First insulator layer 322 may include, for example, high temperature oxide (HTO) and/or other dielectric material. Second insulator layer 334 may be composed of one or more dielectric films including silicon dioxide and/or silicon nitride. Although structure 300 has been described as provided in a single step, it is understood that this step may include a variety of different steps to arrive at structure 300.

As also shown in FIG. 11, a next step includes forming an emitter opening 350 by selectively removing portions of extrinsic base layer 330 and second insulator layer 334 to expose first insulator layer 322. Emitter opening 350 may be formed in a conventional fashion, e.g., depositing an emitter window mask, patterning and etching. The etching may be any conventional etching such as reactive ion etching (RIE). FIG. 11 also shows another step including forming a first spacer 362 along a sidewall 364 of emitter opening 350. First spacer 362 may be of any now known or later developed spacer material such as silicon nitride. Next, as also shown in FIG. 11, first insulator layer 322 is selectively removed inside emitter opening 350 only, which results in an undercutting of spacer 362. The removal step may include conducting a wet etch of the HTO inside emitter opening 350.

Figure 12:
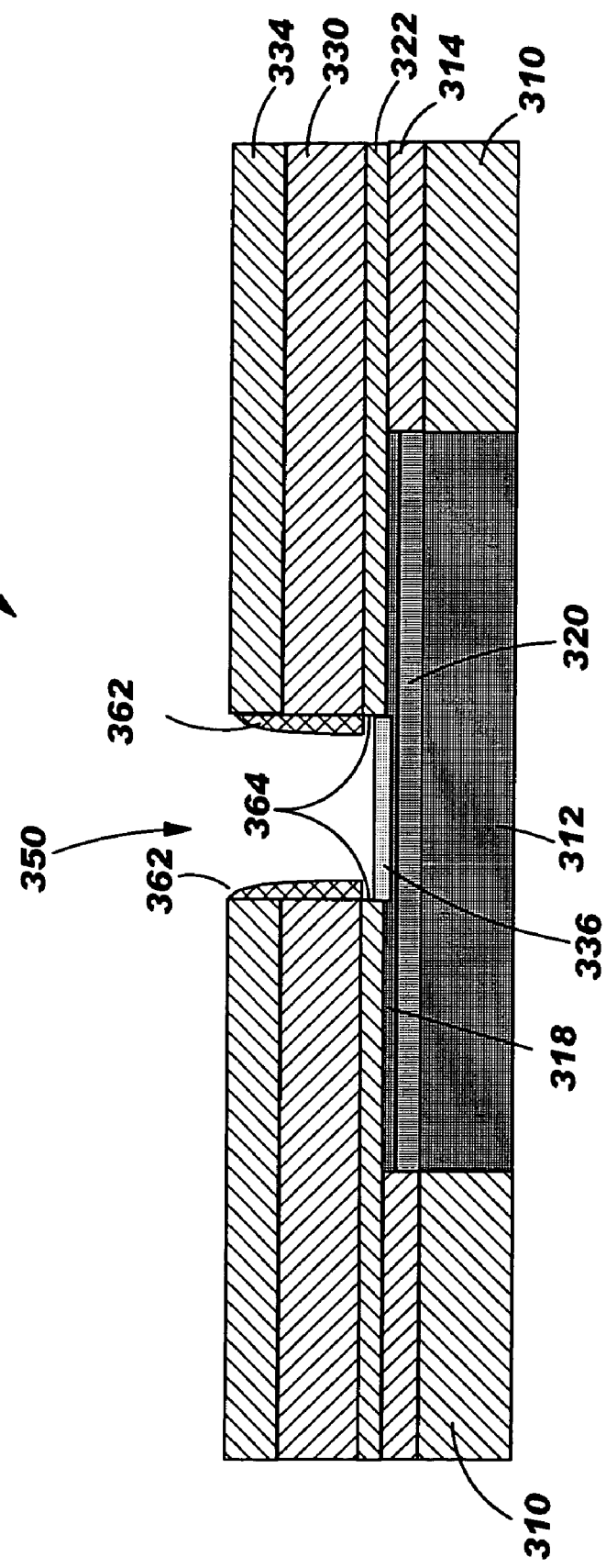
FIG. 12 shows a second step of the second embodiment of the method.

Turning to FIG. 12, a next step includes forming a third insulator layer 336 in a lower portion of emitter opening 350. In one embodiment, third insulator layer 336 is silicon dioxide selectively grown so as to consume at least a portion of emitter cap 318, or selectively deposited. For reasons to be described below, however, third insulator layer 336 may be any dielectric having a higher etch rate than that of first insulator layer 322.

Figure 13:
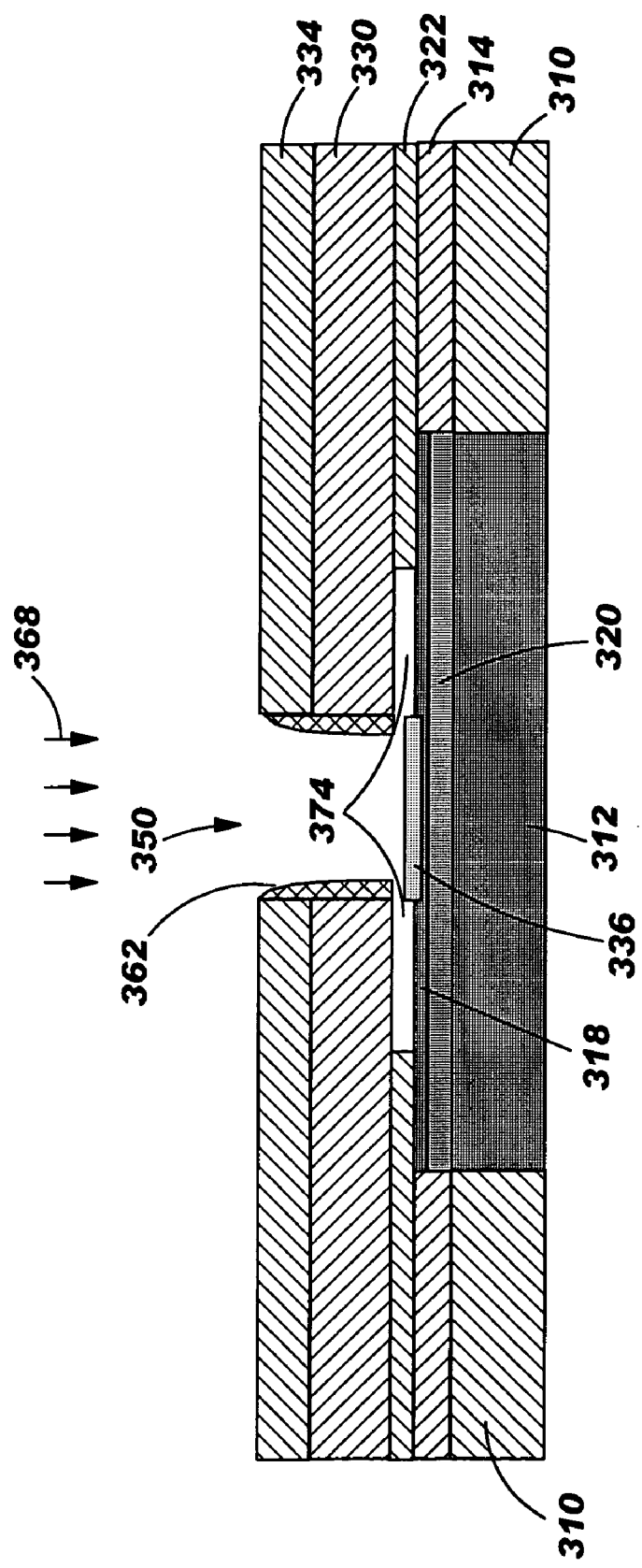
FIG. 13 shows a third step of the second embodiment of the method.

As shown in FIG. 13, the next step includes selectively removing first insulator layer 322 to form an undercut 374 under raised extrinsic base layer 330. In one embodiment, this removal step includes employing a wet etch chemistry 368 having a higher etch rate for first insulator layer 322 than third insulator layer 336. Accordingly, most of third insulator layer 336 survives this removal step.

Figure 14:
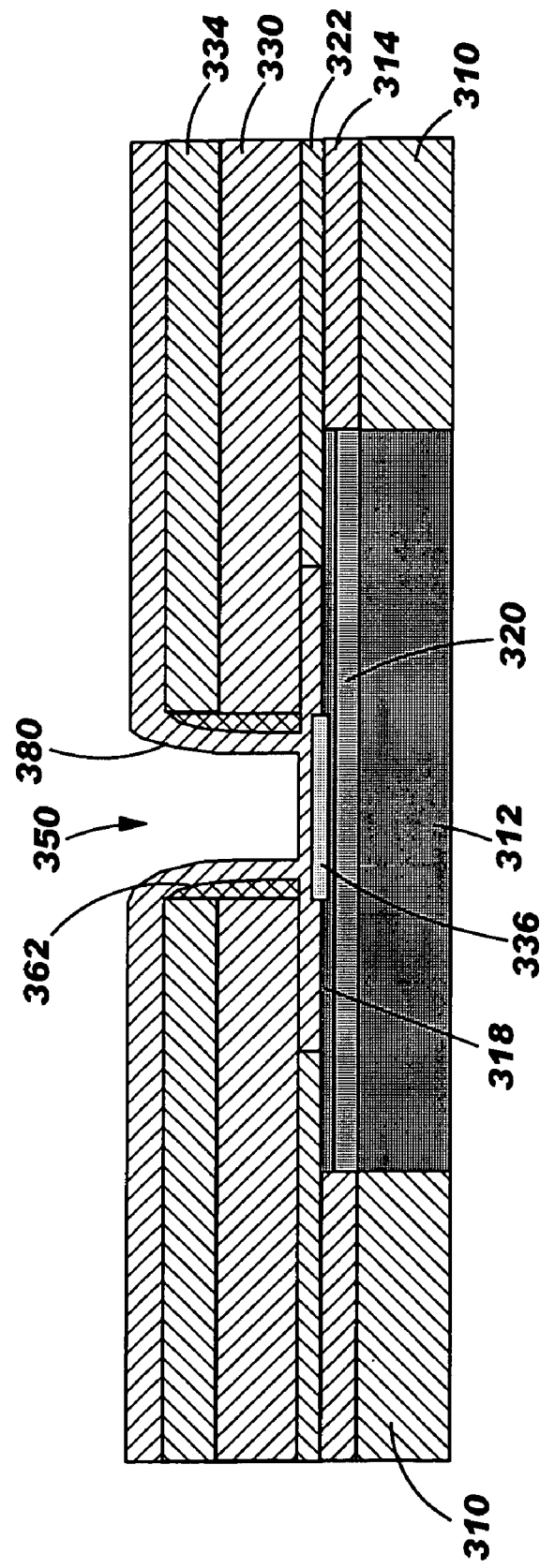
FIG. 14 shows a fourth step of the second embodiment of the method.

In FIG. 14, a next step includes forming a conductive link layer 380 in emitter opening 350 that fills the undercut 374 (FIG. 13). Link layer 380 may include silicon or silicon germanium, and may be formed by a low temperature selective or non-selective epitaxial growth, or a deposition, e.g., by a chemical vapor deposition (CVD) technique. In one embodiment, link layer 380 is low temperature epitaxial silicon.

Figure 15:
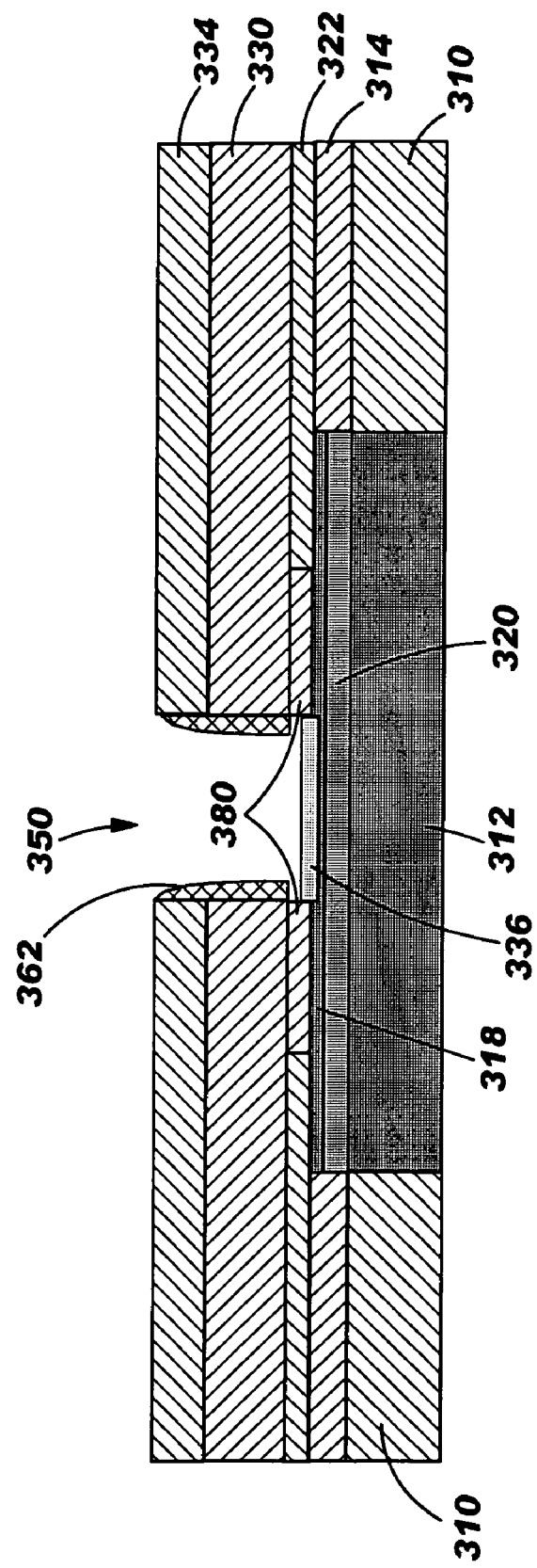
FIG. 15 shows a fifth step of the second embodiment of the method.

Selectively removing link layer 380 to third insulator layer 336 within emitter opening 350 is next, as shown in FIG. 15. This step leaves link layer 380 beneath raised extrinsic base layer 322 to the extent that undercuts 374 (FIG. 13) extend into first insulator layer 322. This step may be conducted using a reactive ion etch (RIE) or a wet etch. By this step, the advantages of linking raised extrinsic base layer 322 and polycrystalline intrinsic base layer 314 can be achieved without attacking the emitter cap 318, as in the first embodiment. That is, third insulator layer 336 of, e.g., HIPOX, controls the depth of penetration into emitter cap 318, and allows use of a wet etch or a RIE to remove the layer 336, which allows for more control compared to an oxidation as in the first embodiment. Accordingly, this embodiment allows better control of the link area because the depth of third insulator layer 336 into emitter cap 318 can be better controlled.

Figure 16:
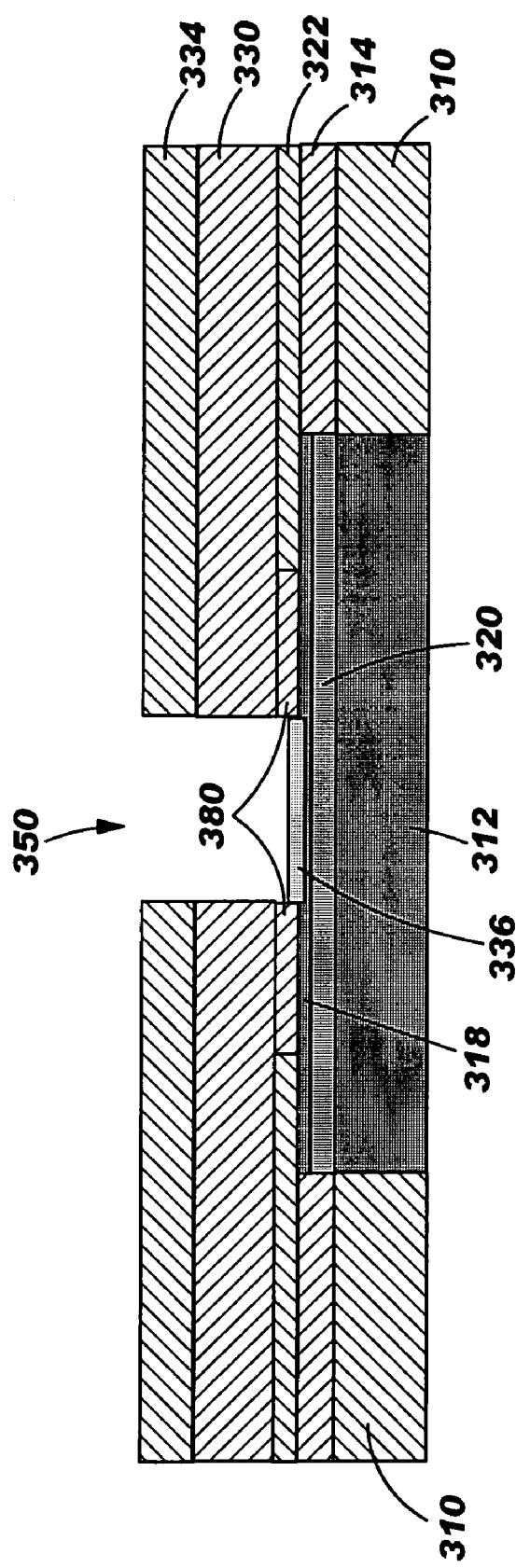
FIG. 16 shows a sixth step of the second embodiment of the method.
Figure 17:
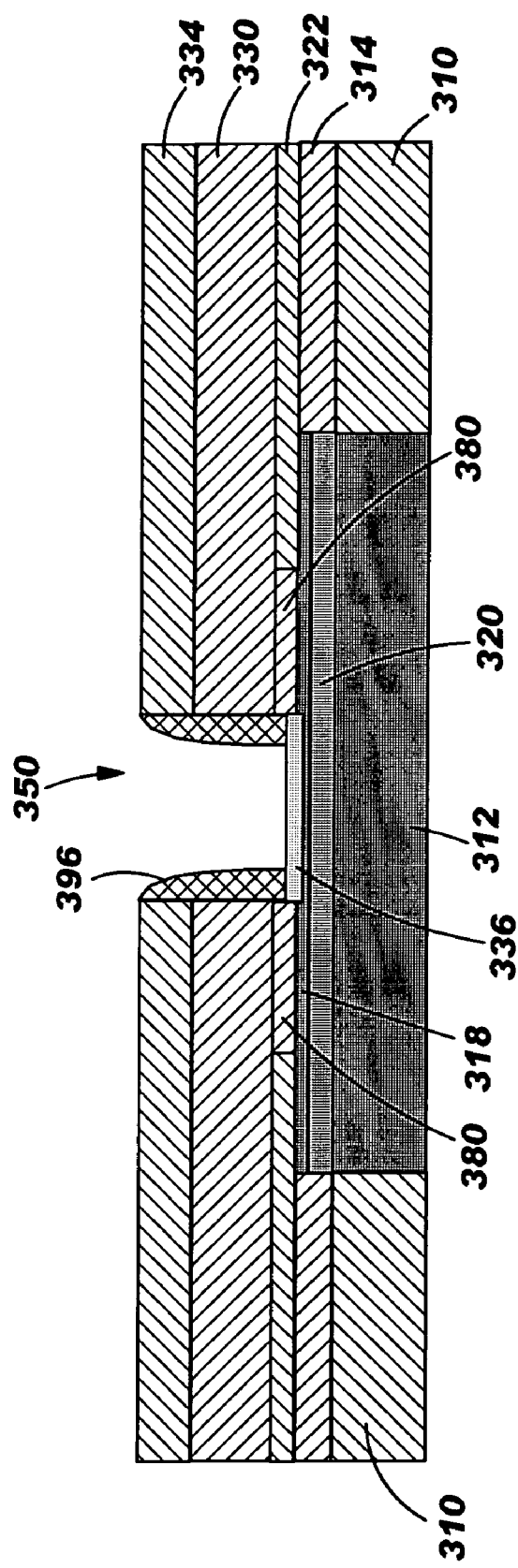
FIG. 17 shows a seventh step of the second embodiment of the method.
Figure 18:
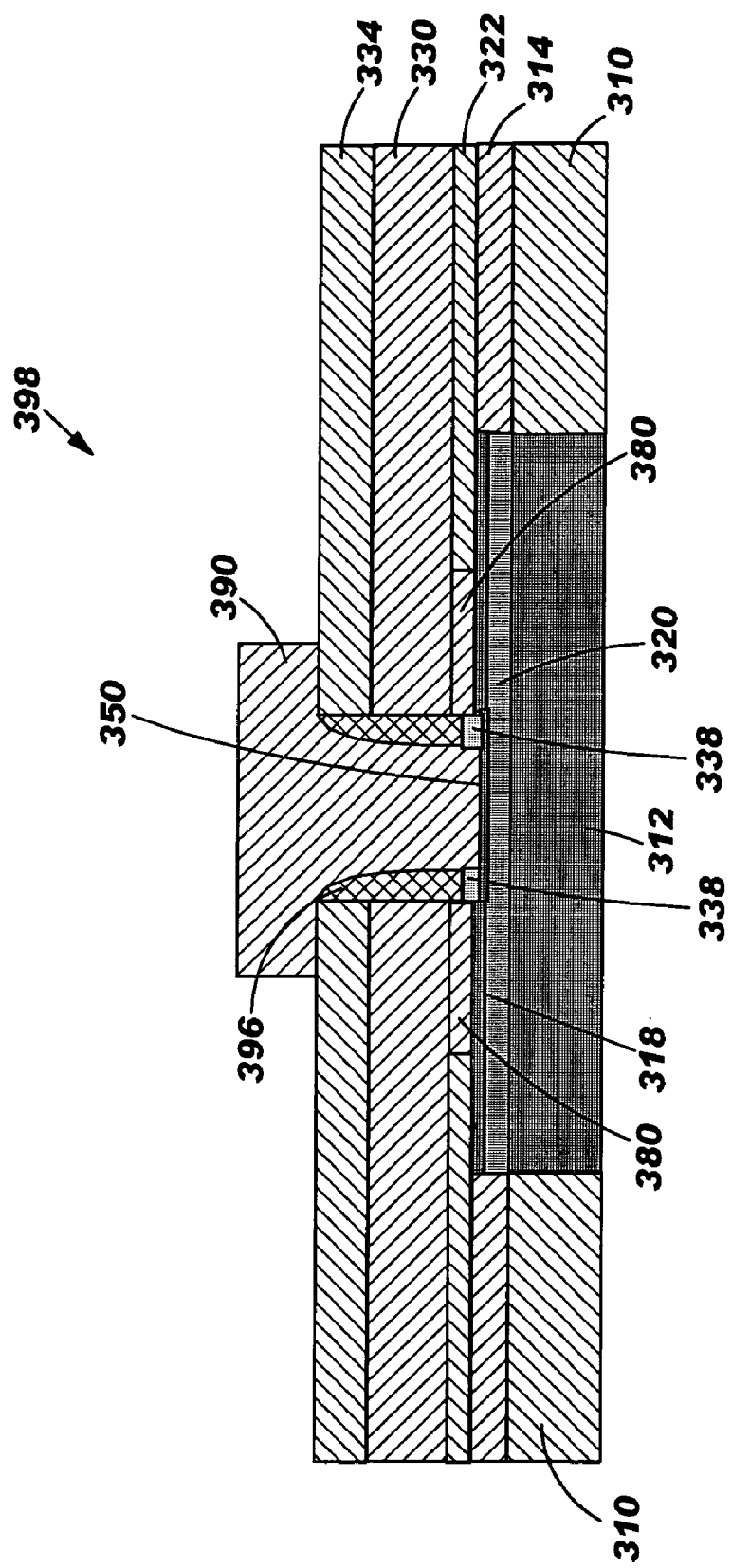
FIG. 18 shows an eighth step of the second embodiment of the method.

As shown in FIGS. 16–18, the final step is to form an emitter 390 (FIG. 18). This step includes removing first spacer 362 (FIG. 15) and any remaining formative layer thereof, as shown in FIG. 16. Next, a second spacer 396 is formed in emitter opening 350, as shown in FIG. 17, in any now known or later developed manner. Second spacer 396 extends to contact third insulator layer 336. Finally, an etch is conducted through third insulator layer 336 to expose emitter cap 318, and an emitter material, e.g., polysilicon, is deposited, patterned and etched to form emitter 390 in emitter opening 350, as shown in FIG. 18. Separation of third insulator layer 336 forms insulator sections 338 of oxide. It should be recognized that as a polysilicon layer is deposited, it may be re-aligned, i.e., some portion is converted to a monocrystalline silicon. Other processing to finalize transistor 398 may be conducted according to any now known or later developed manner. Transistor 398 includes a polycrystalline intrinsic base layer 314 adjacent intrinsic base 320 and emitter cap 318; a raised extrinsic base layer 330; an emitter 390 separated from raised extrinsic base layer 330 by second spacer 396 and an insulator (oxide) section 338 under second spacer 396; and a conductive base link 380 adjacent insulator (oxide) section 338 and below raised extrinsic base layer 330. Raised extrinsic base layer 330 is linked to intrinsic base 320 by emitter cap 318 and conductive base link 380. Emitter cap 318 may include a dopant diffusion (e.g., boron) from raised extrinsic base layer 330. In this embodiment, emitter cap 318 below emitter 390 may be thinner compared to emitter cap 318 below conductive base link 380 due to the consumption of emitter cap 318 by third insulator layer 336 when it is epitaxially grown.

3. Third Embodiment

Figure 19:
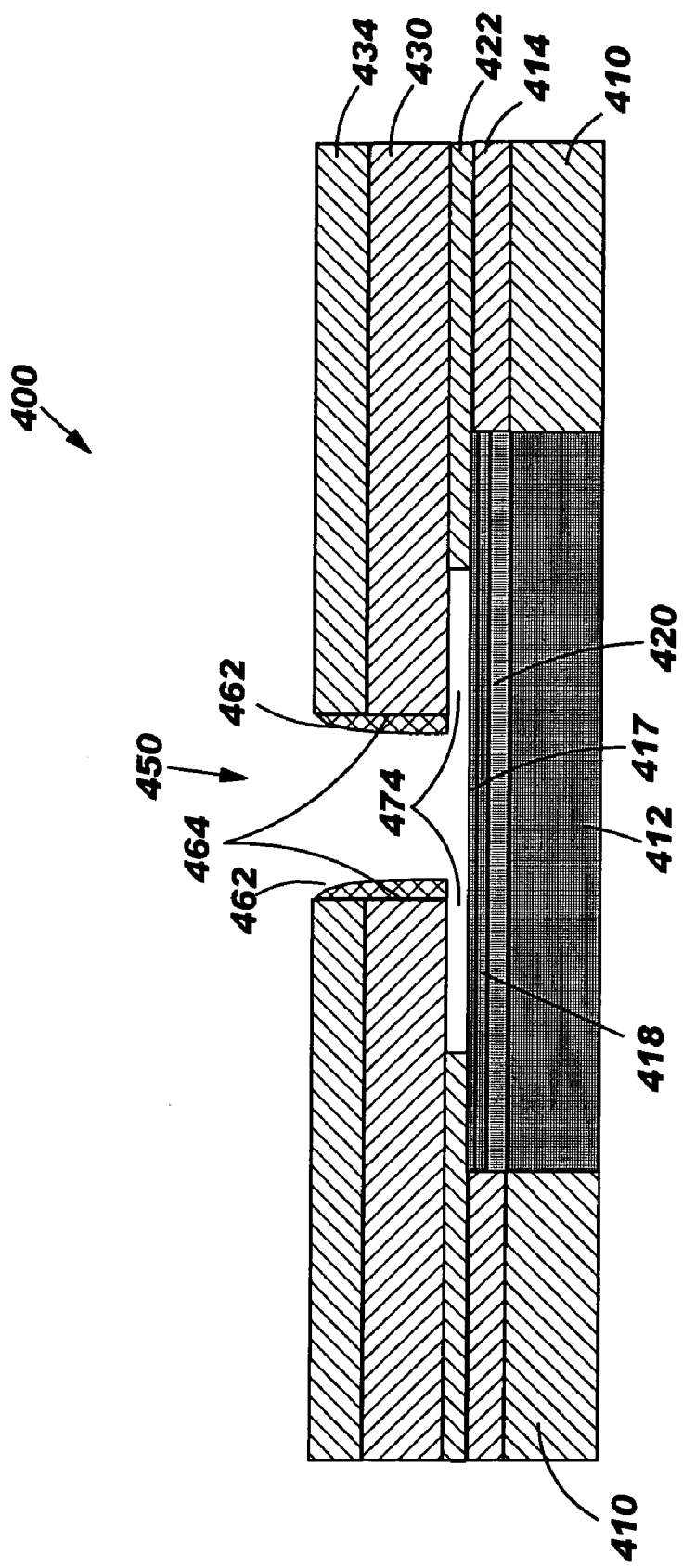
FIG. 19 shows a ninth step of the second embodiment of the method.

Referring to FIGS. 19–26, a third embodiment of the invention will now be described. FIG. 19 illustrates a starting point for the processing of the invention according to the second embodiment. In FIG. 19, a structure 400 is provided including a polycrystalline intrinsic base layer 414 including an intrinsic base 420, an emitter cap 418, and a thin silicon-germanium (SiGe) etch-stop layer 417 over emitter cap 418. Provision of emitter cap 418, SiGe etch-stop layer 417 and intrinsic base 420, which may include SiGe, may be formed by a conventional low temperature selective or non-selective epitaxial growth. Polycrystalline intrinsic base layer 414 is adjacent to intrinsic base 420, emitter cap 418 and etch-stop layer 417, and is deposited over STI 410 of, for example, silicon dioxide. Over polysilicon intrinsic base layer 414 and SiGe etch-stop layer 417 is provided a first insulator layer 422, a raised extrinsic base layer 430 over first insulator layer 422, and a second insulator layer 434 over raised extrinsic base layer 430. Polycrystalline intrinsic base layer 414 and extrinsic base layer 430 may include, for example, polysilicon or polycrystalline SiGe. Polycrystalline intrinsic base layer 414 is deposited over shallow trench isolations (STI) 410 of, for example, silicon dioxide. First insulator layer 422 may include, for example, high temperature oxide (HTO) and/or other dielectric material. Although structure 400 has been described as provided in a single step, it is understood that this step may include a variety of different steps to arrive at structure 400.

Similarly to the second embodiment, the next steps of the third embodiment, as shown in FIG. 19, include forming an emitter opening 450 by selectively removing portions of extrinsic base layer 430 and second insulator layer 434 to expose first insulator layer 422. Emitter opening 450 may be formed in a conventional fashion, e.g., depositing an emitter window mask, patterning and etching. The etching may be any conventional etching such as reactive ion etching (RIE). FIG. 19 also shows another step including forming a first spacer 462 along a sidewall 464 of emitter opening 450. First spacer 462 may be of any now known or later developed spacer material such as silicon nitride.

Next, as also shown in FIG. 19, first insulator layer 422 is selectively removed inside emitter opening 450 selective to SiGe etch-stop layer 417. The removal also extends beyond emitter opening 450, which results in an undercutting 474 of spacer 462 and a portion of raised extrinsic base layer 430. The removal step may include conducting a wet etch that is selective to SiGe etch-stop layer 417.

Figure 20:
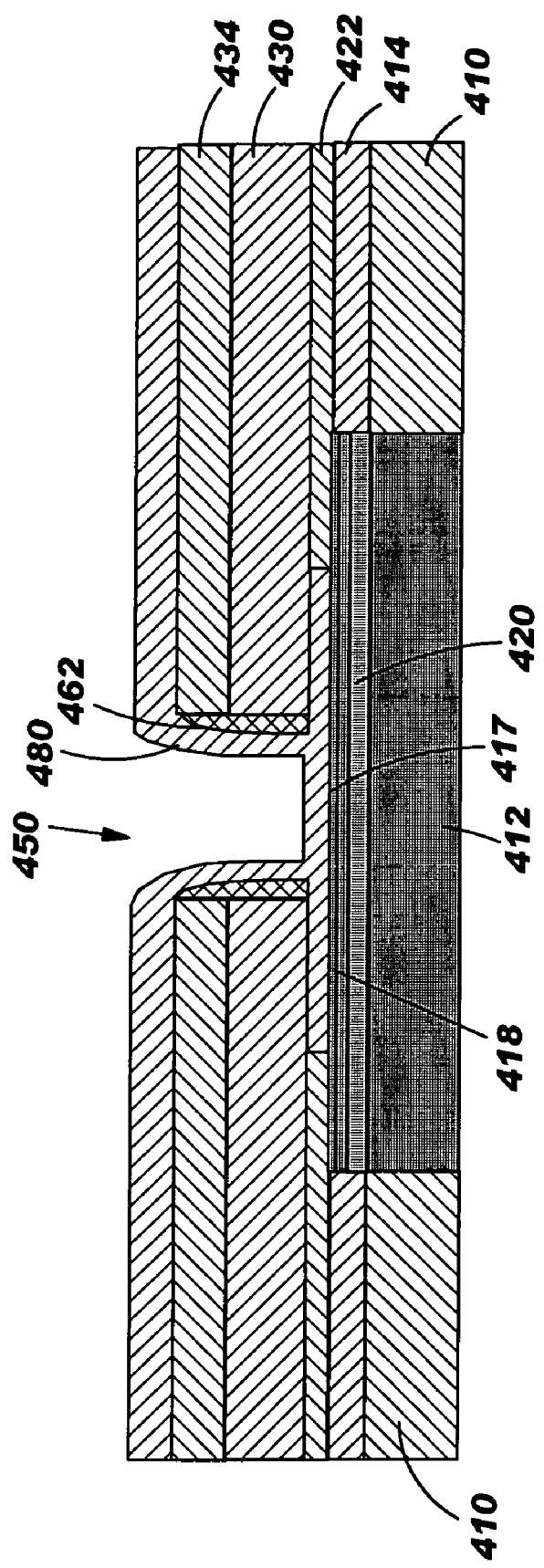
FIG. 20 shows a tenth step of the second embodiment of the method and a resulting bipolar transistor.

Next, as shown in FIG. 20, a next step includes forming a conductive link layer 480 that fills undercut 474 (FIG. 19). Link layer 480 may include silicon, and may be formed by a low temperature epitaxial growth, or deposited, e.g., by a CVD technique.

Figure 21:
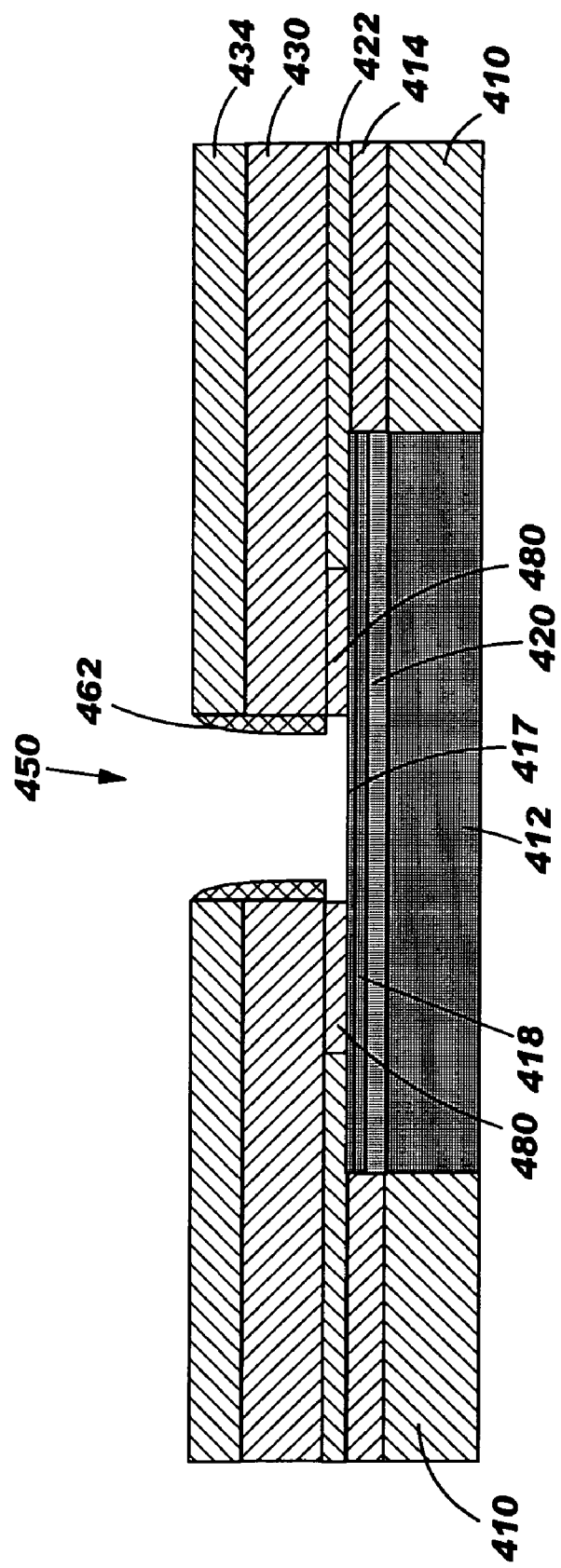
FIG. 21 shows a first step of a third embodiment of a method of fabricating a bipolar transistor with a raised extrinsic base.

Selective removal of link layer 480 to SiGe etch-stop layer 417 within emitter opening 450 is next, as shown in FIG. 21. This step leaves link layer 480 beneath raised extrinsic base layer 430 to the extent that undercuts 474 (FIG. 19) extend into first insulator layer 42.2, but removes link layer 480 from beneath first spacer 462. This step may be conducted using a wet etch, RIE or plasma etch, each selective to SiGe etch-stop layer 417. By this step, the advantages of linking raised extrinsic base layer 430 and intrinsic base 420 can be achieved without attacking emitter cap 418, which allows better control of the link area. That is, SiGe etch-stop layer 417 acts as an etch stop, and allows better control of the depth of penetration into emitter cap 418, i.e., emitter cap 418 is uniform.

Figure 22:
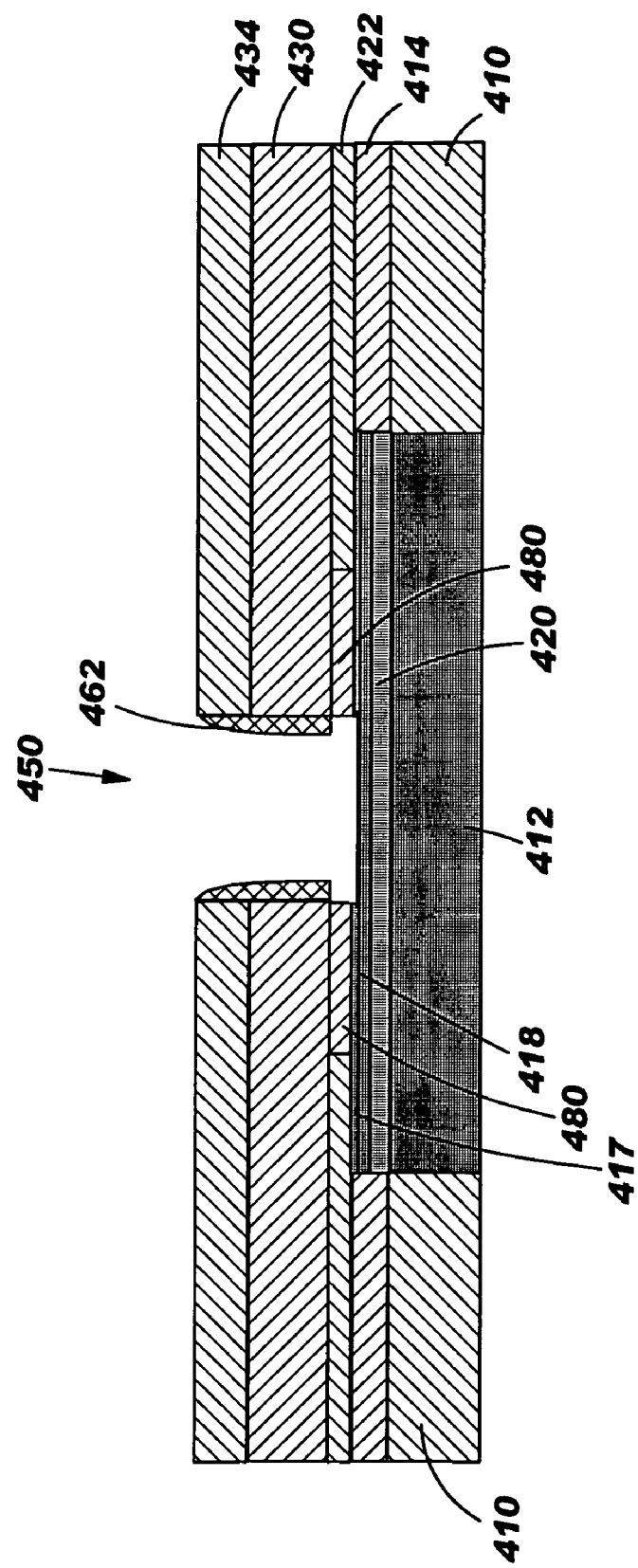
FIG. 22 shows a second step of the third embodiment of the method.

FIG. 22 shows a next step of removing SiGe etch-stop layer 417 in emitter opening 450 selective to emitter cap 418, i.e., expose emitter cap 418. This step may include a wet etch selective to first silicon layer 419 of emitter cap 418.

Figure 23:
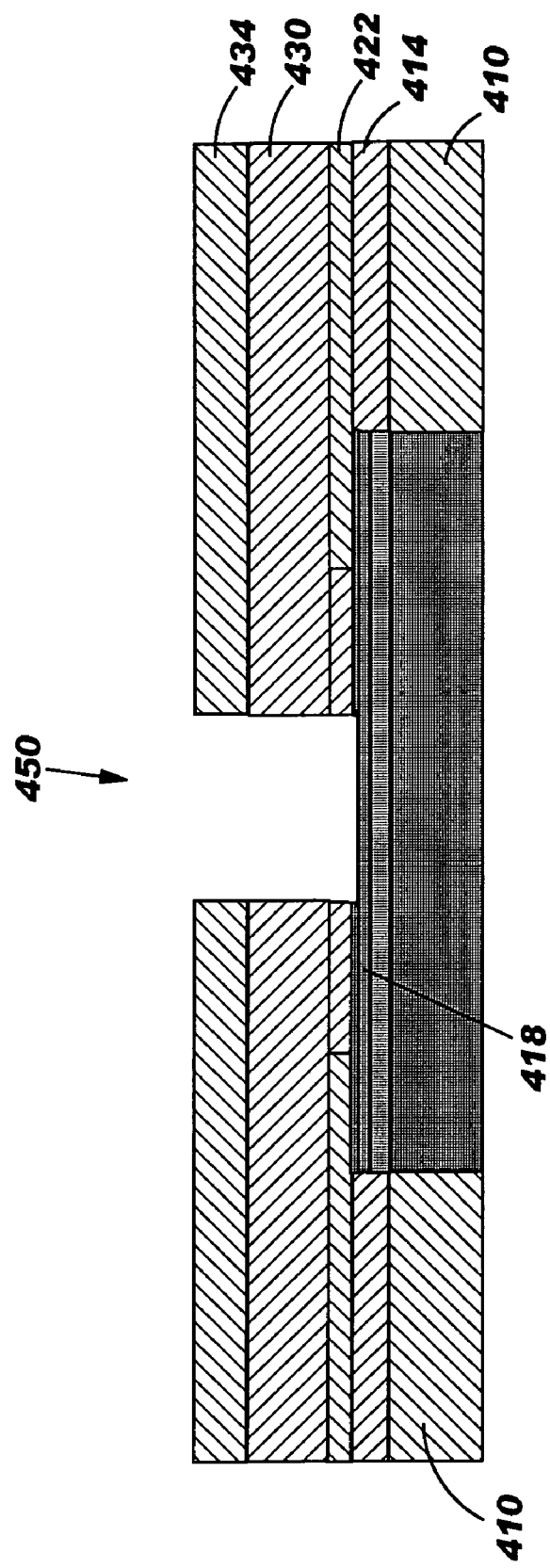
FIG. 23 shows a third step of the third embodiment of the method.

As shown in FIG. 23, a next step includes removing first spacer 462 (FIG. 22) and any remaining formative layer thereof.

Figure 24:
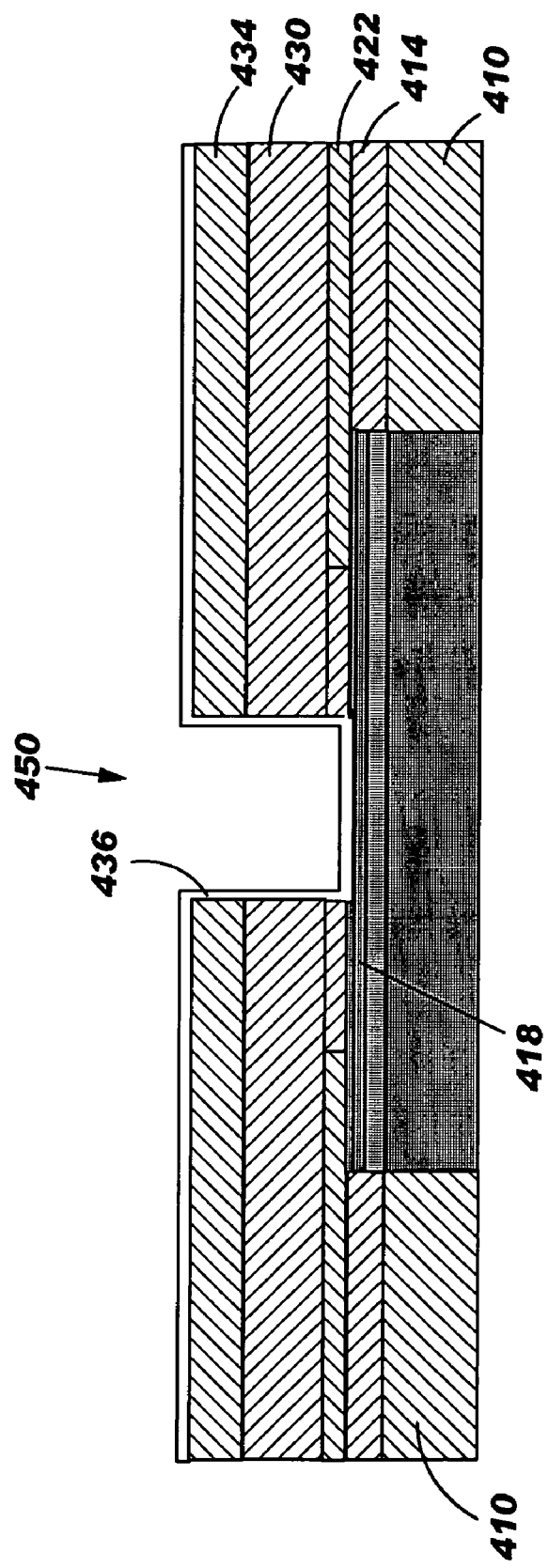
FIG. 24 shows a fourth step of the third embodiment of the method.

Next, as shown in FIG. 24, a third insulator layer 436 is deposited about emitter opening 450. In one embodiment, this step may include a high temperature or low temperature deposition of silicon dioxide (oxide).

Figure 25:
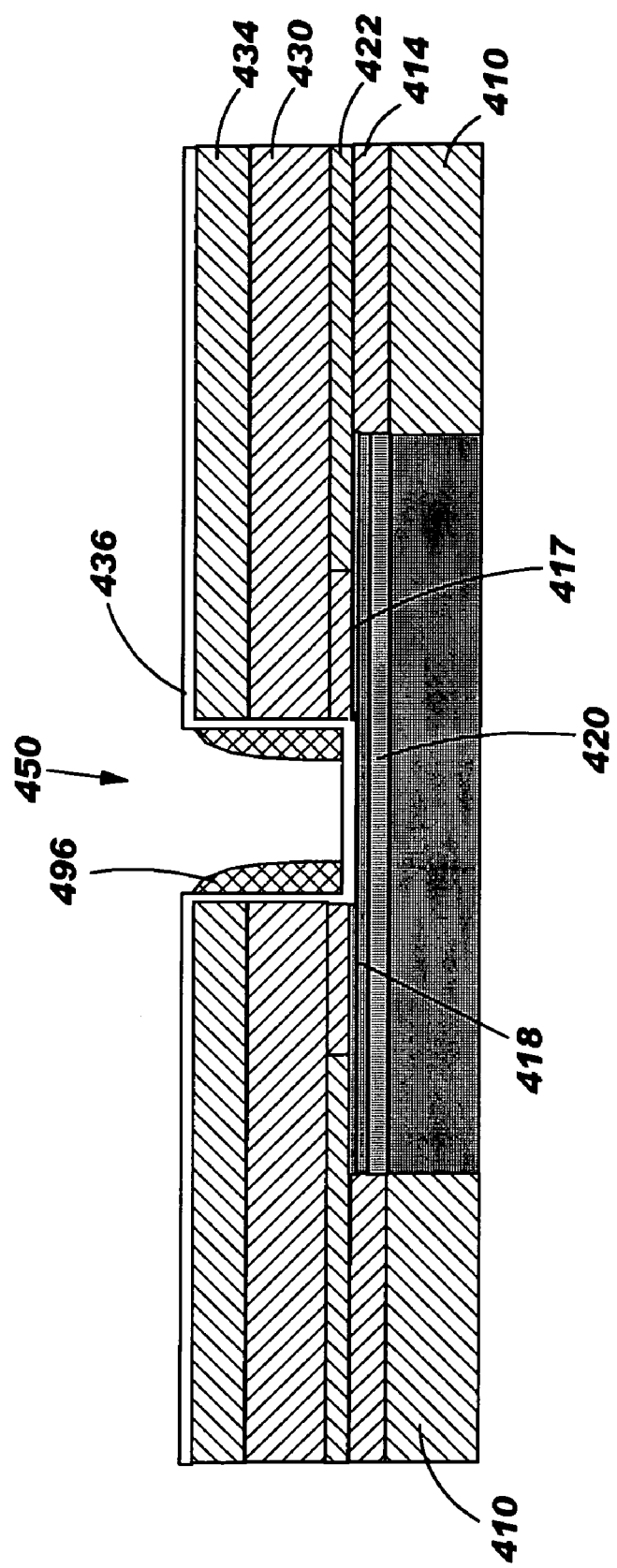
FIG. 25 shows a fifth step of the third embodiment of the method.

Turning to FIG. 25, a next step includes forming a second spacer 496 in emitter opening 450 in any now known or later developed manner. Second spacer 496 extends to contact third insulator layer 436.

As shown in FIG. 26, a next step includes removing third insulator layer 436 as defined by second spacer 496. This step includes etching through third insulator layer 436 to expose emitter cap 418. Separation of third insulator layer 436 forms insulator sections 438 of oxide. Finally, as shown in FIG. 26, an emitter material, e.g., polysilicon, is deposited, patterned and etched to from emitter 490 in the emitter opening. It should be recognized that as a polysilicon layer is deposited, it may be re-aligned, i.e., some portion is converted to a mono-crystalline silicon. Other processing to finalize transistor 498 may be conducted according to any now known or later developed manner. Transistor 498 includes a polycrystalline intrinsic base layer 414 adjacent an intrinsic base 420 and an emitter cap 418; a raised extrinsic base layer 430; an emitter 490 separated from raised extrinsic base layer 430 by spacer 496 and an insulator (oxide) section 438 under spacer 496; and a conductive base link 480 adjacent insulator (oxide) section 438 and below raised extrinsic base layer 430. In this embodiment, the remaining portion of SiGe etch-stop layer 417 also forms part of conductive base link 480. Furthermore, insulator (oxide) section 438 also includes a vertically-extend portion 499 between spacer 496 and raised extrinsic base 430 so as to form a double-spacer. Emitter cap 418 may include a dopant diffusion (e.g., boron) from raised extrinsic base layer 430.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A self-aligned bipolar transistor structure comprising:
    an intrinsic base layer adjacent an intrinsic base and an emitter cap;
    a raised extrinsic base layer;
    an emitter separated from the raised extrinsic base layer by a spacer and an oxide section under the spacer; and
    a conductive base link adjacent the oxide section and below the raised extrinsic base layer,
    wherein the raised base layer is linked to the intrinsic base by the emitter cap and the conductive base link.

2. The transistor structure of claim 1, wherein the raised extrinsic base includes polysilicon.

3. The transistor structure of claim 1, wherein the conductive base link includes silicon.

4. The transistor structure of claim 1, wherein the emitter cap below the emitter is thinner compared to the emitter cap below the conductive base link.

5. The transistor structure of claim 1, wherein the conductive base link includes a portion of a silicon-germanium etch-stop layer.

6. The transistor structure of claim 1, wherein the oxide section also includes a vertically-extending portion between the spacer and the raised extrinsic base.

* * * * *

UNITED STATES PATENT AND TRADEMARK OFFICE
CERTIFICATE OF CORRECTION

PATENT NO.         : 7,119,416 B1
APPLICATION NO.    : 11/169444
DATED              : October 10, 2006
INVENTOR(S)        : Thomas N. Adam et al.

It is certified that error appears in the above-identified patent and that said Letters Patent is hereby corrected as shown below:

Col. 1, Line 8, Insert

--Notice of Government Rights
This invention was made with Government support under N6601-02-C-8014 awarded by DARPA.
The Government has certain rights in this invention.--

Signed and Sealed this
Eleventh Day of September, 2012

David J. Kappos
*Director of the United States Patent and Trademark Office*